US 9,502,759 B2

(12) United States Patent
Ninomiya et al.

(10) Patent No.: US 9,502,759 B2
(45) Date of Patent: Nov. 22, 2016

(54) ANTENNA COVER AND PLASMA GENERATING DEVICE USING SAME

(71) Applicant: Sumitomo Heavy Industries Ion Technology Co., Ltd., Tokyo (JP)

(72) Inventors: Shiro Ninomiya, Ehime (JP); Masateru Sato, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 22 days.

(21) Appl. No.: 14/566,133

(22) Filed: Dec. 10, 2014

(65) Prior Publication Data

US 2015/0162657 A1 Jun. 11, 2015

(30) Foreign Application Priority Data

Dec. 11, 2013 (JP) .................. 2013-256014

(51) Int. Cl.

| | | |
|---|---|---|
| *H01Q 1/26* | (2006.01) | |
| *H01Q 1/40* | (2006.01) | |
| *H05H 1/46* | (2006.01) | |
| *H01J 37/32* | (2006.01) | |
| *H01Q 1/42* | (2006.01) | |
| *H01Q 7/00* | (2006.01) | |

(52) U.S. Cl.
CPC .............. *H01Q 1/40* (2013.01); *H01J 37/321* (2013.01); *H01J 37/3211* (2013.01); *H01Q 1/42* (2013.01); *H01Q 1/421* (2013.01); *H01Q 7/00* (2013.01); *H05H 1/46* (2013.01); *H05H 2001/4652* (2013.01); *H05H 2001/4667* (2013.01)

(58) Field of Classification Search
None
See application file for complete search history.

(56) References Cited

U.S. PATENT DOCUMENTS

| | | | |
|---|---|---|---|
| 5,824,158 A | 10/1998 | Takeuchi et al. | |
| 6,181,069 B1* | 1/2001 | Tonotani | H05H 1/46 |
| | | | 118/723 I |
| 6,323,595 B1 | 11/2001 | Tonotani et al. | |
| 6,607,633 B2* | 8/2003 | Noguchi | H01J 37/32192 |
| | | | 118/723 ME |
| 7,455,030 B2 | 11/2008 | Sakai | |
| 8,840,844 B2 | 9/2014 | Fujita et al. | |
| 2008/0218086 A1 | 9/2008 | Sakai | |
| 2010/0129272 A1 | 5/2010 | Fujita et al. | |

FOREIGN PATENT DOCUMENTS

| | | |
|---|---|---|
| JP | H07-018433 A | 1/1995 |
| JP | H11-233289 A | 8/1999 |
| JP | H11-317299 A | 11/1999 |
| JP | 2000-040475 A | 2/2000 |
| JP | 4001185 B1 | 10/2007 |
| JP | 2010-123467 A | 6/2010 |

* cited by examiner

*Primary Examiner* — Anh Tran
(74) *Attorney, Agent, or Firm* — Michael Best & Friedrich LLP (57) ABSTRACT

An antenna cover that protects a surface of an antenna provided in a plasma chamber and exciting an electric field with a high frequency to an inner portion of the plasma chamber is provided. In the antenna cover, the thickness of the antenna cover in at least one direction among directions orthogonal to the surface of the antenna is different according to a position on the surface, such that space dependency of an electric potential on an external surface of the antenna cover decreases. In the antenna cover, the thickness of at least one direction may be changed along an extension direction of the antenna.

12 Claims, 10 Drawing Sheets

ANTENNA COVER AND PLASMA GENERATING DEVICE USING SAME

BACKGROUND OF THE INVENTION

1. Field of the Invention

The present invention relates to an antenna cover that protects an antenna of a plasma generating device.

2. Description of the Related Art

In a plasma generating device, for example, plasma electrons are accelerated by an RF electric field generated in the vicinity of an antenna in a plasma chamber and plasma is generated. At this time, if the antenna is exposed to the plasma, the antenna is sputtered, which results in becoming the pollution cause of the plasma. For this reason, a member for protecting the antenna from the generated plasma is provided. For example, a partition plate is provided between the plasma chamber and an antenna chamber to protect the antenna.

Because the protection member of the antenna is exposed to the plasma, the protection member is damaged by the plasma. If the protection member is abraded under an influence of the plasma and a hole is formed in the protection member, the antenna is exposed to the plasma and the plasma is polluted. If the protection member is formed thick or the antenna or the protection member is arranged to be distant from a generation position of the plasma, abrasion of the protection member can be decreased. However, generation efficiency of the plasma is deteriorated.

SUMMARY OF THE INVENTION

One of exemplary objects of an aspect of the present invention is to provide an antenna cover in which an influence of abrasion by plasma is decreased while generation efficiency of the plasma is maintained and a plasma generating device using the same.

According to an aspect of the present invention, there is provided an antenna cover for protecting a surface of an antenna provided in a plasma chamber and exciting an electric field with a high frequency to an inner portion of the plasma chamber. The thickness of the antenna cover in at least one direction among directions orthogonal to the surface of the antenna is different according to a position on the surface, such that space dependency of an electric potential on an external surface of the antenna cover decreases.

According to an aspect of the present invention, there is provided a plasma generating device. The plasma generating device includes: a plasma chamber; a magnet that applies a magnetic field to an inner portion of the plasma chamber; an antenna that is provided in the plasma chamber and excites and electric field with a high frequency to the inner portion of the plasma chamber; and an antenna cover that protects a surface of the antenna. The thickness of the antenna cover in at least one direction among directions orthogonal to the surface of the antenna is different according to a position on the surface, such that space dependency of an electric potential on an external surface of the antenna cover decreases.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, byway of example only, with reference to the accompanying drawings that are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

Hereinafter, modes to carry out the present invention will be described in detail with reference to the drawings. In the description of the drawings, like elements are denoted by like reference numerals and overlapped description is appropriately omitted. In addition, configurations to be described below are exemplary and do not limit the scope of the present invention.

Figure 1:
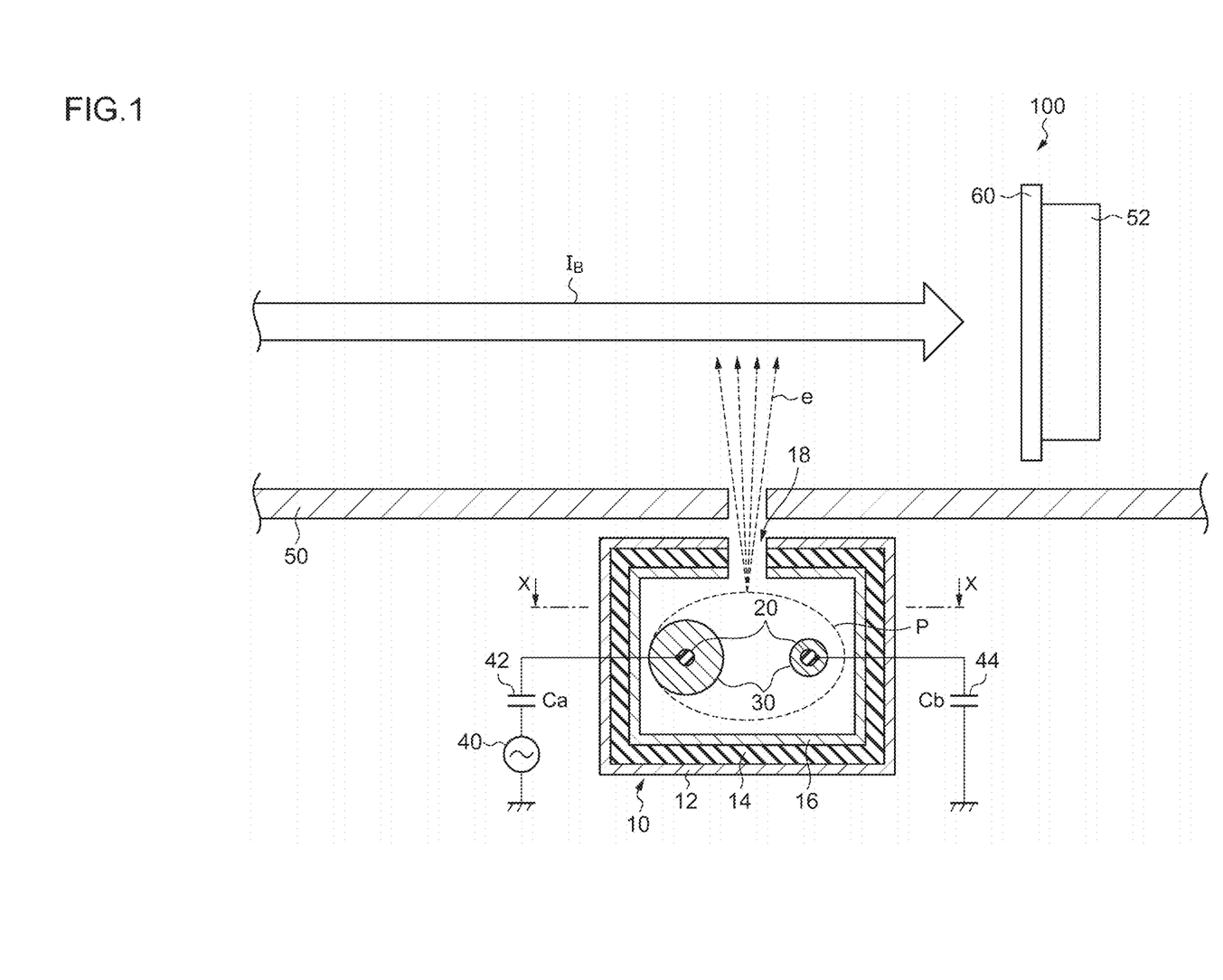
FIG. 1 is a schematic diagram illustrating an ion implantation device according to an embodiment.

FIG. 1 is a schematic diagram illustrating an ion implantation device 100 according to an embodiment. The ion implantation device 100 is configured to irradiate an ion beam $I_B$ to a surface of a workpiece 60 and execute an ion implantation process. The workpiece 60 is fixed to a stage 52 provided in a housing 50 and the ion beam $I_B$ is irradiated from an ion source (not illustrated in the drawings) to the workpiece 60. The workpiece 60 is a substrate formed of a wafer, for example.

The ion implantation device 100 includes a plasma generating device 10. The plasma generating device 10 generates plasma P in a plasma chamber 12, extracts electrons e in the plasma, and supplies the electrons to an inner portion of the housing 50. Thereby, electrification (charge up) of a surface of the workpiece 60 by the irradiation of the ion beam $I_B$ is suppressed.

The plasma generating device 10 forms a confining magnetic field in an internal surface of the plasma chamber 12 by a magnet device 14. Thereby, the plasma generating device 10 suppresses dissipation of the plasma electrons and generates and maintains the plasma P. Because an antenna 20 is arranged in a generation place of the plasma P to increase generation efficiency of the plasma, an antenna cover 30 to protect the antenna 20 from the plasma P is provided. In this embodiment, the thickness of the antenna cover 30 is changed according to a position on a surface of the antenna 20, so that local abrasion of the antenna cover 30 by the plasma P is suppressed. Hereinafter, the plasma generating device 10 according to this embodiment will be described.

(First Embodiment)

The plasma generating device 10 includes the plasma chamber 12, the magnet device 14, an insulating member 16, and an extraction opening 18. The plasma chamber 12 has a box shape of an approximately rectangular parallelepiped and is formed of a non-magnetic metal material such as aluminum or stainless steel. The magnetic device 14 that applies a magnetic field to an inner portion of the plasma chamber 12 is provided in an inner wall of the plasma chamber 12. The extraction opening 18 that extracts the plasma generated in the plasma chamber 12 is provided in one surface of the plasma chamber 12.

The magnet device 14 is mounted to cover the inner wall of the plasma chamber 12. The magnet device 14 forms the confining magnetic field in the internal surface of the plasma chamber 12. Thereby, the magnet device 14 suppresses the dissipation of the plasma electrons and maintains and generates the plasma P. The magnet device 14 is a permanent magnet, for example, and is arranged such that magnets having different polarities are arranged alternately along the inner wall of the plasma chamber 12. By the arrangement of the magnet device 14 or the strength of the magnetic force, the generation position of the plasma P is adjusted. As the magnet device 14, an electromagnet may be used. In addition, the magnet device 14 may be arranged at the outside of the plasma chamber 12.

The insulating member 16 is arranged at the inside of the magnet device 14 and protects the plasma chamber 12 and the magnet device 14 from the plasma P. In addition, the insulating member 16 prevents the plasma chamber 12 or the magnet device 14 from being sputtered by the plasma P and prevents the plasma P from being polluted by metal particles and the like. The insulating member 16 is made of a ceramic material such as quartz ($SiO_2$) or alumina ($Al_2O_3$), for example.

The plasma generating device 10 includes the antenna 20 and the antenna cover 30. The antenna 20 is provided in the plasma chamber 12 and generates an RF electric field excited by an RF current flowing through the antenna in a range of a certain distance from a surface of the antenna. The antenna 20 has a U shape. A high frequency of, for example, 13.56 MHz is input to both ends of the antenna 20 having the U shape.

One end of the antenna 20 is connected to a high frequency power supply 40 through a first capacitor 42 having a first capacitance Ca. The other end of the antenna 20 is connected to a ground through a second capacitor 44 having a second capacitance Cb. The first capacitor 42 and the second capacitor 44 correspond to a matcher used for impedance matching with the high frequency power supply 40 and the capacities Ca and Cb of the capacitors suitable for the impedance matching are selected. In this embodiment, the case in which the second capacitance Cb is larger than the first capacitance Ca (Ca<Cb) will be described.

The antenna cover 30 covers the surface of the antenna 20 and protects the antenna 20 from the plasma P. The antenna cover 30 has a tube shape of a U shape to correspond to the antenna 20 having the U shape. The antenna cover 30 is formed of a ceramic material such as quartz ($SiO_2$) or alumina ($Al_2O_3$), preferably, the quartz.

Figure 2:
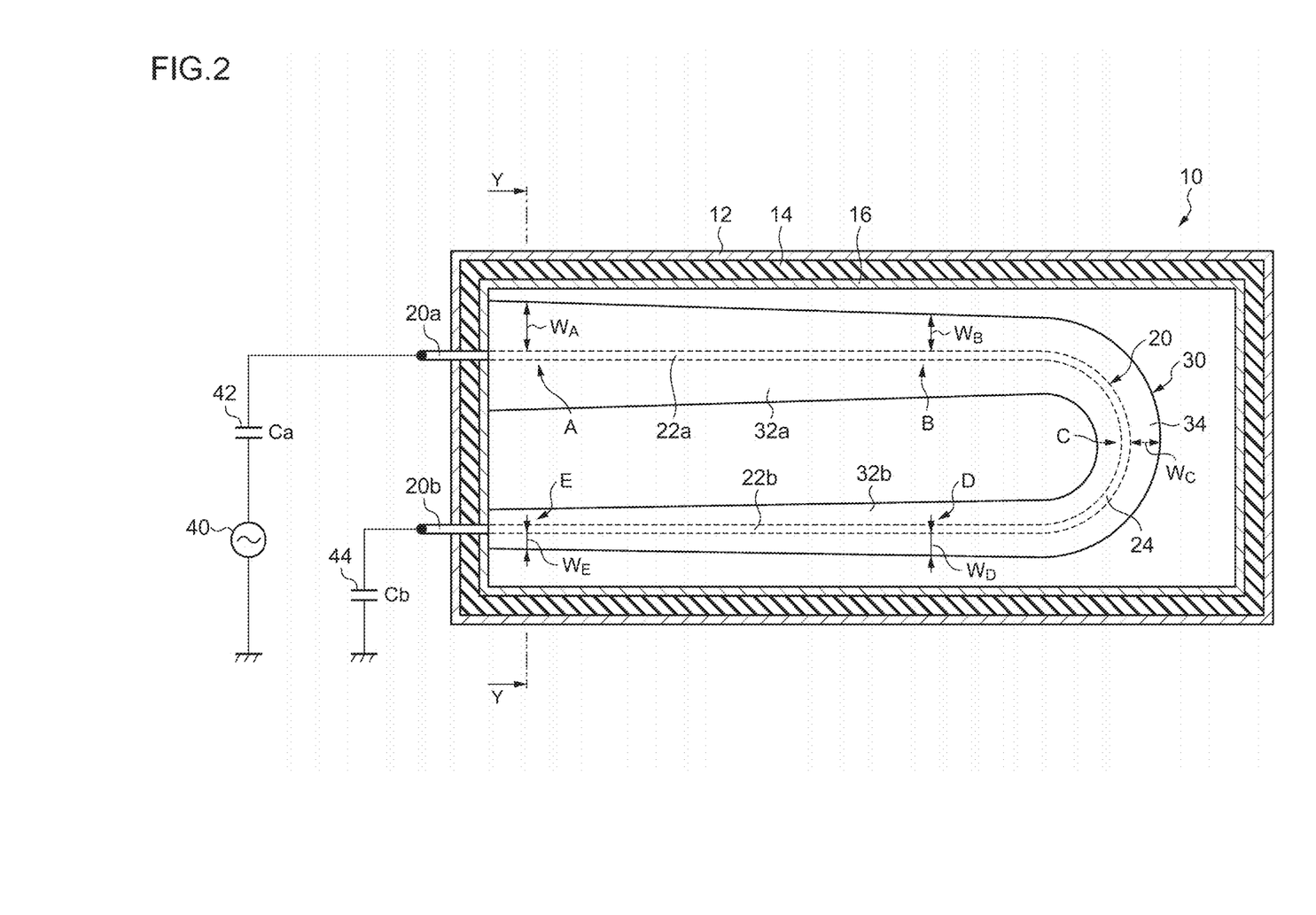
FIG. 2 is a schematic diagram illustrating a plasma generating device according to an embodiment.
Figure 3:
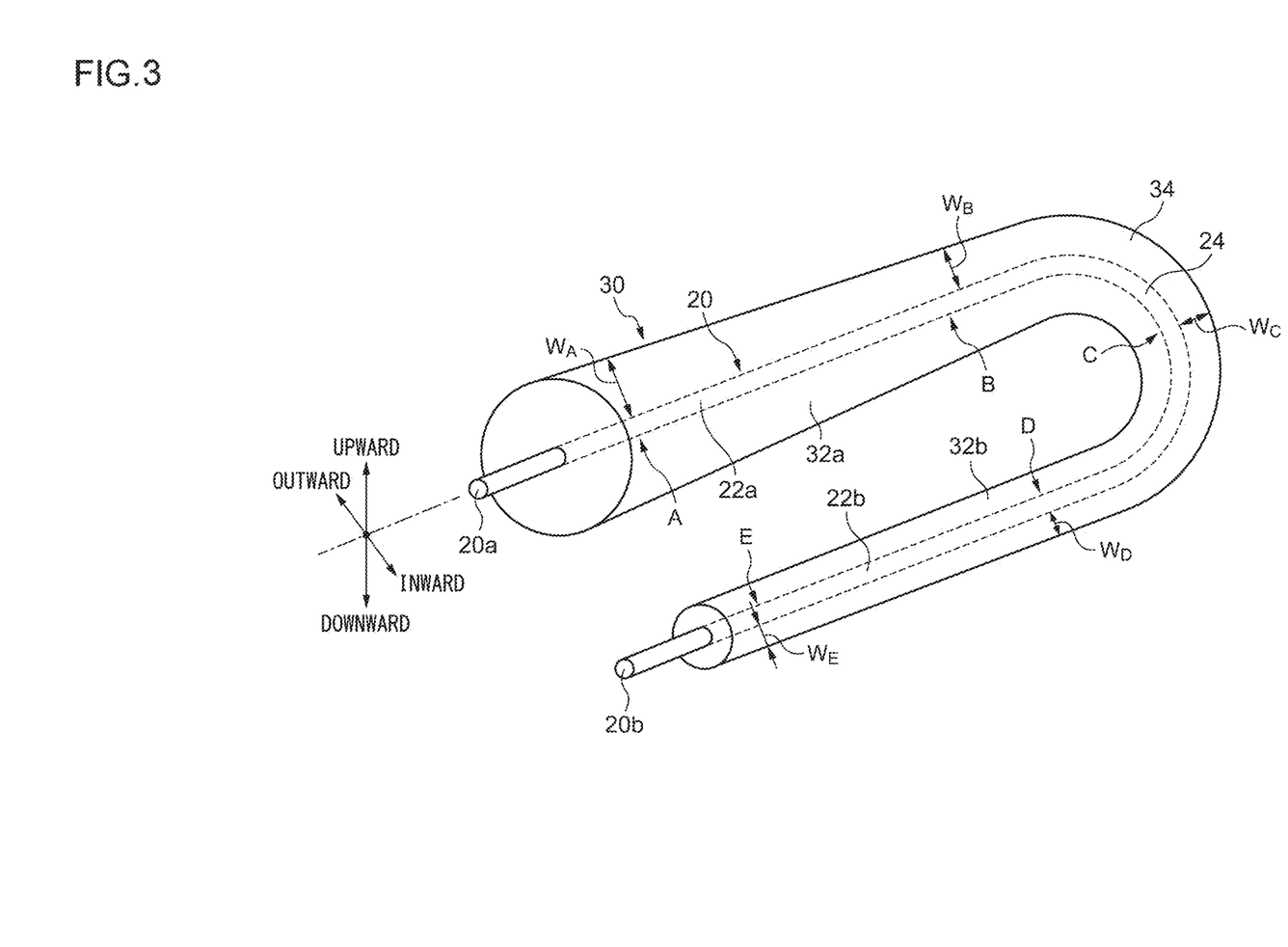
FIG. 3 is a perspective view of an external appearance illustrating an antenna and an antenna cover according to an embodiment.

FIG. 2 is a schematic diagram illustrating the plasma generating device 10 according to the first embodiment and illustrates a cross-section taken along the line X-X of FIG. 1. FIG. 3 is a perspective view of an external appearance illustrating the antenna 20 and the antenna cover 30 according to the first embodiment. FIG. 1 illustrates a cross-section taken along the line Y-Y of FIG. 2. As illustrated in the drawings, the antenna cover 30 according to this embodiment has a structure in which the thickness ($W_A$ to $W_E$) of a radial direction changes along an extension direction of the antenna 20 having the U shape. Here, the radial direction is a direction that crosses or is orthogonal to the extension direction of the antenna 20 and a direction that crosses or is orthogonal to the surface of the antenna 20.

The antenna 20 has a first straight line portion 22a, a second straight line portion 22b, and a curved line portion 24 bent in a circular arc shape and configures the U shape by them. The antenna 20 is formed of a rod-shaped or hollow conductive material, for example, copper (Cu) or aluminum (Al). For example, the antenna 20 is configured by performing bending on a hollow copper pipe to a U shape. In addition, the antenna 20 has a first terminal 20a and a second terminal 20b provided at both ends, respectively. The first terminal 20a that is provided in the first straight line portion 22a is connected to the high frequency power supply 40 through the first capacitor 42. The second terminal 20b that is provided in the second straight line portion 22b is connected to a ground through the second capacitor 44.

In the following description, expressions of an A spot, a B spot, a C spot, a D spot, and an E spot may be used to describe a position on the surface of the antenna 20. The A spot shows a position close to the first terminal 20a in the first straight line portion 22a and the B spot shows a position close to the curved line portion 24 and distant from the first terminal 20a in the first straight line portion 22a. The C spot shows a position of a center portion of the curved line portion 24. The D spot shows a position close to the curved line portion 24 and distant from the second terminal 20b in the second straight line portion 22b. The E spot shows a position close to the second terminal 20b in the second straight line portion 22b.

In addition, expressions of an inward direction, an outward direction, an upward direction, and a downward direction may be used as a direction orthogonal to the extension direction of the antenna 20. The inward direction is a direction toward the inner side of the antenna 20 having the U shape and a direction opposite to the inward direction is the outward direction. The upward direction is a direction toward the extraction opening 18 among directions crossing a plane formed by the U shape of the antenna 20 and a direction opposite to the upward direction is the downward direction. For example, when the extension direction of the first straight line portion 22a is used as a reference, as illustrated in FIG. 3, a direction toward the second straight line portion 22b from the first straight line portion 22a is the inward direction and a direction opposite to the inward direction is the outward direction. In addition, directions orthogonal to both the extension direction of the first straight line portion 22a and the inward/outward direction are vertical directions and a direction toward the extraction opening 18 among the vertical directions is the upward direction and a direction opposite to the upward direction is the downward direction.

The antenna cover 30 has a first straight line protecting portion 32a to cover the first straight line portion 22a, a second straight line protecting portion 32b to cover the second straight line portion 22b, and a curved line protecting portion 34 to cover the curved line portion 24. The antenna cover 30 has a U shape in which the first straight line protecting portion 32a, the second straight line protecting portion 32b, and the curved line protecting portion 34 are integrally formed. The individual members may be divided and the antenna cover 30 having the U shape may be configured by combining these members.

The first straight line protecting portion 32a is a hollow member that covers the first straight line portion 22a including the A spot and the B spot. The first straight line protecting portion 32a has a shape of a circular truncated cone obtained by removing a small circular cone from a top portion of a circular cone and the thickness $W_A$ of a radial direction of the first straight line protecting portion 32a covering the A spot is larger than the thickness $W_B$ of the radial direction of the first straight line protecting portion 32a covering the B spot. Therefore, the first straight line protecting portion 32a has a shape in which the thickness of the radial direction gradually decreases from the A spot to the B spot.

The second straight line protecting portion 32b is a hollow member that covers the second straight line portion 22b including the D spot and the E spot. The second straight line protecting portion 32b has a shape of a circular truncated cone and the thickness $W_D$ of a radial direction of the second straight line protecting portion 32b covering the D spot is larger than the thickness $W_E$ of the radial direction of the second straight line protecting portion 32b covering the E spot. Therefore, the second straight line protecting portion 32b has a shape in which the thickness of the radial direction gradually decreases from the D spot to the E spot.

The curved line protecting portion 34 is a hollow member that covers the curved line portion 24 including the C spot and is bent in a circular arc shape (C shape) to correspond to the shape of the curved line portion 24. The curved line protecting portion 34 is formed such that the thickness $W_C$ of a radial direction at the C spot is smaller than the thickness $W_B$ of the radial direction at the B spot and is larger than the thickness $W_D$ of the radial direction at the D spot. In addition, the curved line protecting portion 34 has a shape in which the thickness of the radial direction gradually decreases from the B spot to the D spot.

By combining the first straight line protecting portion 32a, the second straight line protecting portion 32b, and the curved line protecting portion 34 of the shapes described above, the antenna cover 30 has a shape in which the thickness of the radial direction gradually decreases from the A spot to the E spot along the extension direction of the antenna 20. The method of changing the thickness of the radial direction may be a linear method and may be a non-linear method.

In addition, the antenna cover 30 is formed such that the thickness of the radial direction becomes isotropic at each spot. Here, when the thickness of the radial direction is isotropic, this means that the thickness for a plurality of different directions among the directions orthogonal to the extension direction of the antenna 20 is almost the same, for example, the thickness for each of the inward direction and the outward direction and the thickness for each of the upward direction and the downward direction are almost the same.

Next, the reason why the thickness of the radial direction of the antenna cover 30 is set differently according to the position on the surface of the antenna 20 will be described. First, local abrasion of the antenna cover by the plasma will be described using a comparative example. Next, an effect of suppressing the local abrasion of the antenna cover in this embodiment will be described.

Figure 4:
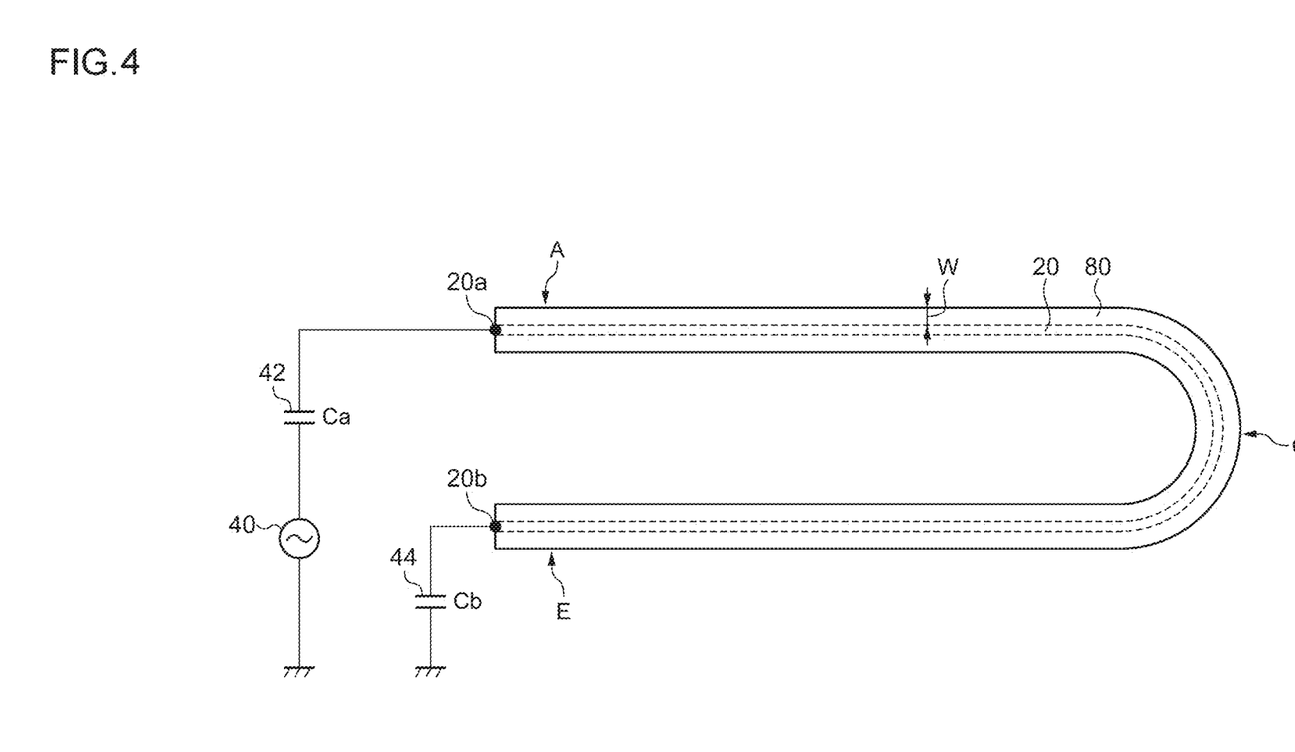
FIG. 4 is a schematic diagram illustrating an antenna and an antenna cover according to a comparative example.

FIG. 4 is a schematic diagram illustrating an antenna 20 and an antenna cover 80 according to the comparative example. The antenna cover 80 according to the comparative example has a shape in which the thickness W of a radial direction becomes constant without depending on a place, differently from this embodiment. The antenna 20 according to the comparative example has the same configuration as that of this embodiment. A first capacitor 42 having a first capacitance Ca to be relatively small is connected to a first terminal 20a and a second capacitor 44 having a second capacitance Cb to be relatively large is connected to a second terminal 20b.

On an external surface of the antenna cover 80 placed in plasma, electrons of the plasma are electrified and a sheath is formed. When the sheath is formed, the external surface of the antenna cover 80 has a negative direct-current electric potential (DC electric potential) for the plasma. Then, positive ions of the plasma are drawn while being accelerated and collide against the external surface of the antenna cover 80. Because ion energies of the colliding positive ions are proportional to the electric potential of the external surface of the antenna cover 80, the positive ions having high ion energies collide against a place having a high electric potential on the external surface and the abrasion of the antenna cover 80 locally increases.

At this time, the electric potential on the external surface of the antenna cover 80 is determined by the capacitance of the antenna 20 and the capacitance of the antenna cover 80 and when the capacitance decreases, the electric potential increases. In the case of the antenna having the U shape, the antenna capacitance is determined by the capacities of the capacitors connected to both ends of the antenna 20. In addition, the capacitance of the antenna cover 80 is determined by the thickness and permittivity of the constituent material of the antenna cover 80. In the comparative example, because the thickness of the antenna cover 80 is constant without depending on the place, the capacitance of the antenna cover 80 is determined by the capacities Ca and Cb of the capacitors connected to both ends of the antenna 20. Because the capacities Ca and Cb of the capacitors connected to both ends of the antenna 20 are asymmetric, the electric potential on the external surface of the antenna cover 80 becomes different according to the position.

Figure 5:
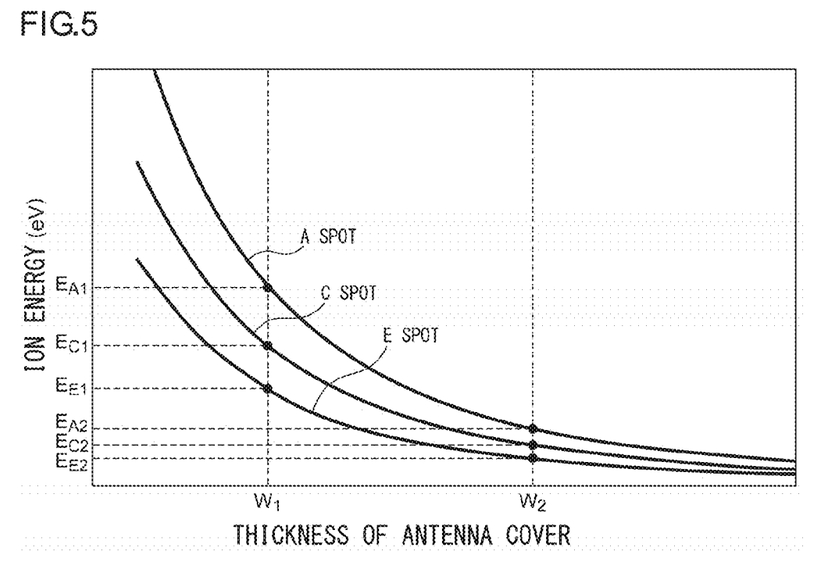
FIG. 5 is a graph illustrating a relation of the thickness of an antenna cover and ion energy in an external surface of the antenna cover according to a comparative example.

FIG. 5 is a graph illustrating a relation of the thickness of the antenna cover 80 and ion energy on the external surface of the antenna cover 80 according to the comparative example. In the comparative example, at the A spot close to the first terminal 20a to which the first capacitor 42 having the small capacitance is connected, the ion energy on the external surface of the antenna cover 80 increases. Meanwhile, at the E spot close to the second terminal 20b to which the second capacitor 44 having the large capacitance is connected, the ion energy on the external surface of the antenna cover 80 is small. At the intermediate C spot, a value of the ion energy between the A spot and the E spot is taken.

In the graph, if the thickness of the antenna cover 80 is set to $W_1$, the ion energies at the A spot, the C spot, and the E spot take different values $E_{A1}$, $E_{C1}$, and $E_{E1}$, respectively. Because the ion energy at the A spot is larger than the ion energies at the other spots, abrasion of the cover is large and the cover becomes easy to be more damaged than the other places. In this case, even when the abrasion at the other spots of the antenna cover 80 is small, the life of the antenna cover 80 may come to an end, due to the local abrasion at the A spot.

Meanwhile, if the thickness of the antenna cover 80 is set to $W_2$, abrasion of the antenna cover 80 can be decreased, because the ion energies at the A spot, the C spot, and the E spot can be set to relatively small values $E_{A2}$, $E_{C2}$, and $E_{E2}$. However, if the thickness of the antenna cover 80 is increased as a whole, a distance from the antenna 20 to the plasma P increases and according to this, an RF electric field at a generation position of the plasma P also decreases. For this reason, generation efficiency of the plasma may be deteriorated.

If the capacities Ca and Cb of the capacitors 42 and 44 connected to both ends of the antenna 20 are equalized, a difference of the ion energies according to places of the antenna 20 may be decreased. However, because the capacitance of the capacitor connected to the antenna 20 may be determined by a method of supplying a high frequency power to the antenna, it is difficult to take any value. In a general impedance matcher, the capacities of the capacitors connected to both ends of the antenna 20 are generally asymmetric.

Figure 6:
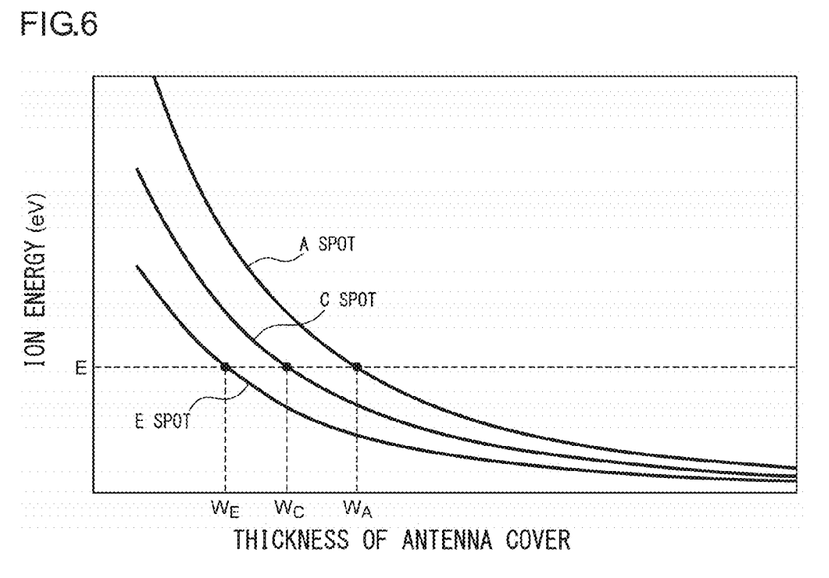
FIG. 6 is a graph illustrating a relation of the thickness of an antenna cover and ion energy in an external surface of the antenna cover according to an embodiment.

Therefore, in this embodiment, space dependency of the electric potential on the external surface of the antenna cover 30 is decreased by changing the thickness of the antenna cover 30 according to the place. FIG. 6 is a graph illustrating a relation of the thickness of the antenna cover 30 and the ion energy on the external surface of the antenna cover 30 according to the embodiment. As illustrated by the graph, the thickness of the antenna cover 30 is changed at each spot and is set to $W_A$, $W_C$, and $W_E$ ($W_A > W_C > W_E$), such that the ion energies at the individual spots of the A spot, the C spot, and the E spot take the same value E.

As described above using FIGS. 2 and 3, the thickness of the antenna cover 30 is relatively increased in a place close to the A spot having the small antenna capacitance and the thickness of the antenna cover 30 is decreased when a place comes close to the E spot having the large antenna capacitance. Thereby, the energies of the positive ions colliding against the antenna cover 30 can be equalized and the local abrasion of the antenna cover 30 can be suppressed. By suppressing the local abrasion, the life of the antenna cover 30 can be increased and reliability of the plasma generating device 10 and the ion implantation device 100 can be increased.

In addition, in this embodiment, the thickness of the antenna cover 30 is changed according to the place, so that it is also said that the capacitance of the antenna cover 30 can be changed according to the place. At the A spot where the capacitance of the antenna 20 is relatively small, the thickness of the antenna cover 30 is increased, so that the capacitance of the antenna cover 30 is decreased. Meanwhile, at the E spot where the capacitance of the antenna 20 is relatively large, the thickness of the antenna cover 30 is decreased, so that the capacitance of the antenna cover 30 is increased. That is, both the capacities of the antenna 20 and the antenna cover 30 are configured to be asymmetric, so that asymmetry of a total value of the capacities of the antenna 20 and the antenna cover 30 is decreased. Thereby, the space dependency of the electric potential on the external surface of the antenna cover 30 is decreased, so that the local abrasion of the antenna cover 30 can be suppressed.

(Second Embodiment)

Figure 7:
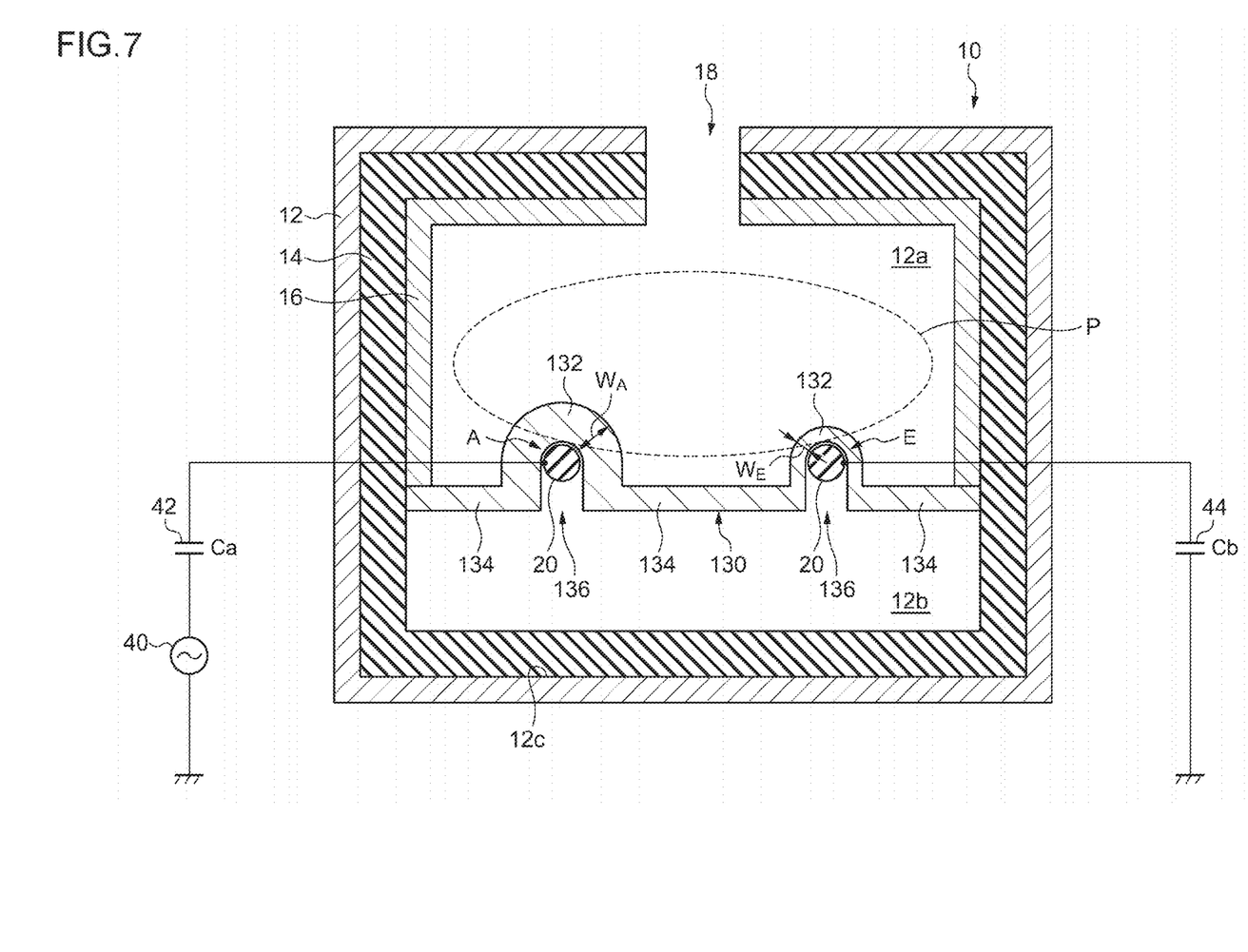
FIG. 7 is a schematic diagram illustrating a plasma generating device according to another embodiment.

FIG. 7 is a schematic diagram illustrating a plasma generating device 10 according to a second embodiment. This embodiment is different from the first embodiment in that an antenna cover 130 to divide an inner portion of a plasma chamber 12 into a first section 12a where plasma is generated and a second section 12b where an antenna 20 is provided is used. In addition, in this embodiment, plasma P is generated in the first section 12a corresponding to a region of the upper half of the plasma chamber 12. Hereinafter, a difference from the first embodiment will be mainly described.

The antenna cover 130 includes a covering portion 132 and a dividing portion 134. The dividing portion 134 has a flat shape and is provided to face a bottom surface 12c facing an extraction opening 18 in a wall surface configuring the plasma chamber 12. Thereby, the dividing portion 134 divides the inner portion of the plasma chamber 12 by two in a vertical direction and partitions the inner portion into the first section 12a to be the region of the upper half where the plasma is generated mainly and the second section 12b to be the region of the lower half where the plasma is not generated. A groove 136 is provided at a position where the antenna 20 is arranged, in the dividing portion 134 having the flat shape. The covering portion 132 that protrudes in an upward direction is provided surrounding the groove 136.

The covering portion 132 covers a surface of the antenna 20 having a U shape and protects the antenna. The covering portion 132 has a shape in which a cylindrical member is cut by two in an axial direction and is provided to mainly cover the region of the upper half in the surface of the antenna 20. The covering portion 132 is provided to protrude from the dividing portion 134 in the upward direction and the groove 136 in which the antenna 20 is accommodated is provided at the inner side of the covering portion 132. By protruding the covering portion 132 in the upward direction, the antenna 20 can be arranged at a position close to the center of the first section 12a.

The covering portion 132 is provided such that the thickness of a radial direction is different according to a position on the surface of the antenna 20. Similarly to the first embodiment, at an A spot close to a connection position of a first capacitor 42 having a small capacitance, the thickness of the radial direction is set to relatively large $W_A$ and at an E spot close to a connection position of a second capacitor 44 having a large capacitance, the thickness of the radial direction is set to relatively small $W_E$. In addition, the covering portion 132 is provided such that the thickness of the radial direction gradually decreases from the A spot to the E spot in an extension direction of the antenna 20.

In the second embodiment, because the plasma P is generated mainly in the first section 12a to be the region of the upper half of the plasma chamber 12, the covering portion 132 to be closer to the region of the upper half than the antenna 20 in the antenna cover 130 is exposed to the plasma. The electric potential on the external surface of the antenna cover 130 is determined by the thickness for an existence direction of the plasma P. Therefore, the thickness of the place exposed to the plasma P may be appropriately set to equalize the ion energy on the external surface of the antenna cover 130.

According to the second embodiment, the thickness of the covering portion 132 is changed according to asymmetry of the antenna capacitance of the antenna 20, so that the ion energy can be equalized on the external surface of the covering portion 132 exposed to the plasma P. For this reason, even when the antenna cover 130 does not cover the entire surface of the antenna 20, the same effect as that of the first embodiment can be obtained.

In addition, according to the second embodiment, because the dividing portion 134 to partition the first section 12a and the second section 12b is provided, the plasma can be prevented from infiltrating into the second section 12b in which the antenna 20 is provided. Thereby, even though the surface of the antenna 20 is exposed to the plasma at the position of the groove 136, the antenna 20 can be protected from the plasma P. In addition, even if the plasma is generated in the second section 12b, the antenna 20 is sputtered, and metal particles are generated, the plasma P of the first section 12a can be prevented from being polluted, by the partition of the antenna cover 130.

In addition, according to the second embodiment, the antenna cover 130 can be easily mounted to the antenna 20 as compared with the first embodiment. In the first embodiment, because the antenna cover 30 covers the entire surface of the antenna 20, it is necessary to integrally form the antenna 20 and the antenna cover 30 or combing the plurality of divided members. Meanwhile, according to the second embodiment, because the antenna 20 may be fitted into the groove 136 of the antenna cover 130, it is easy to form the antenna 20 and the antenna cover 130 separately and the antenna 20 and the antenna cover 130 may be easily assembled.

(Third Embodiment)

Figure 8:
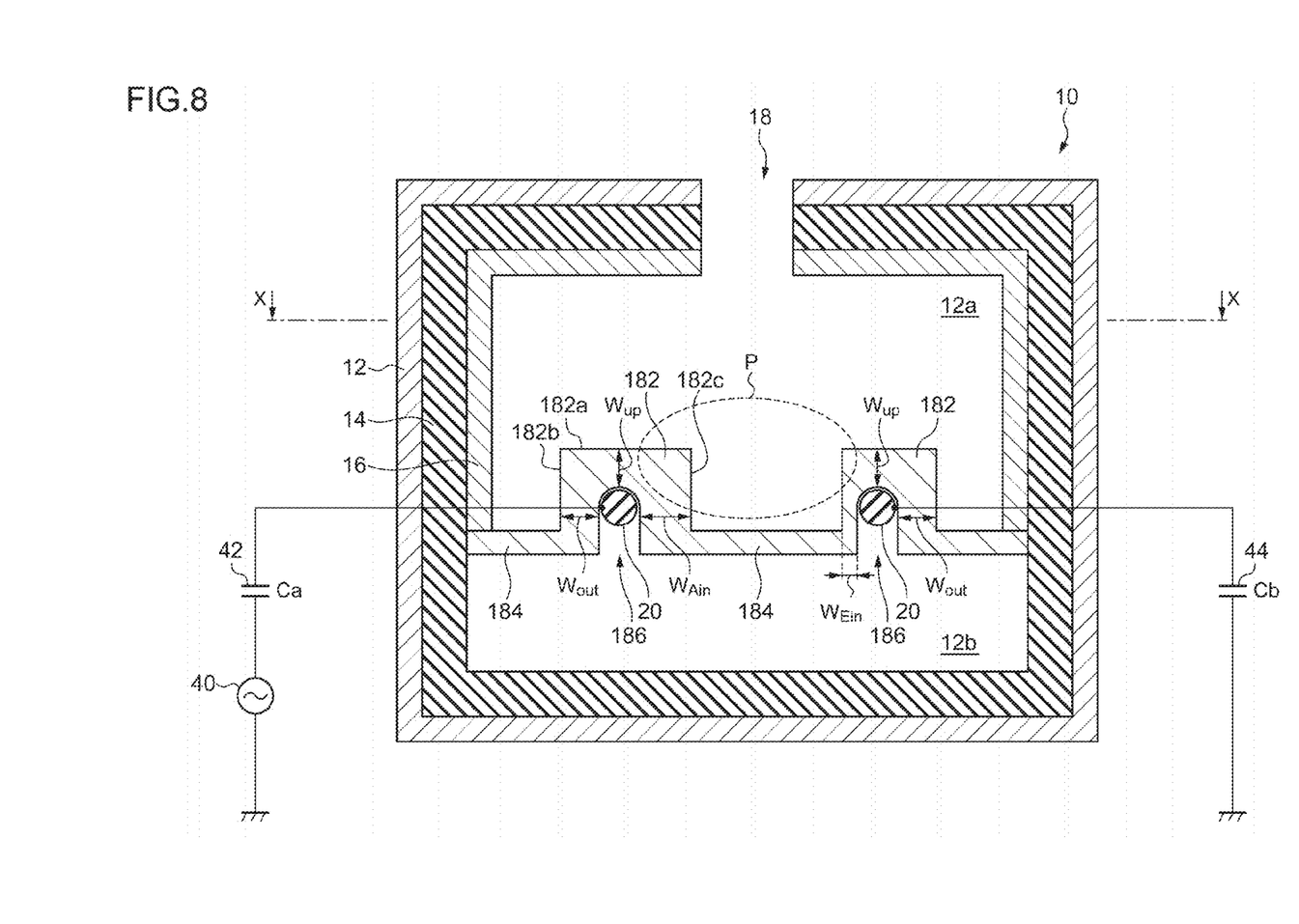
FIG. 8 is a schematic diagram illustrating a plasma generating device according to another embodiment.
Figure 9:
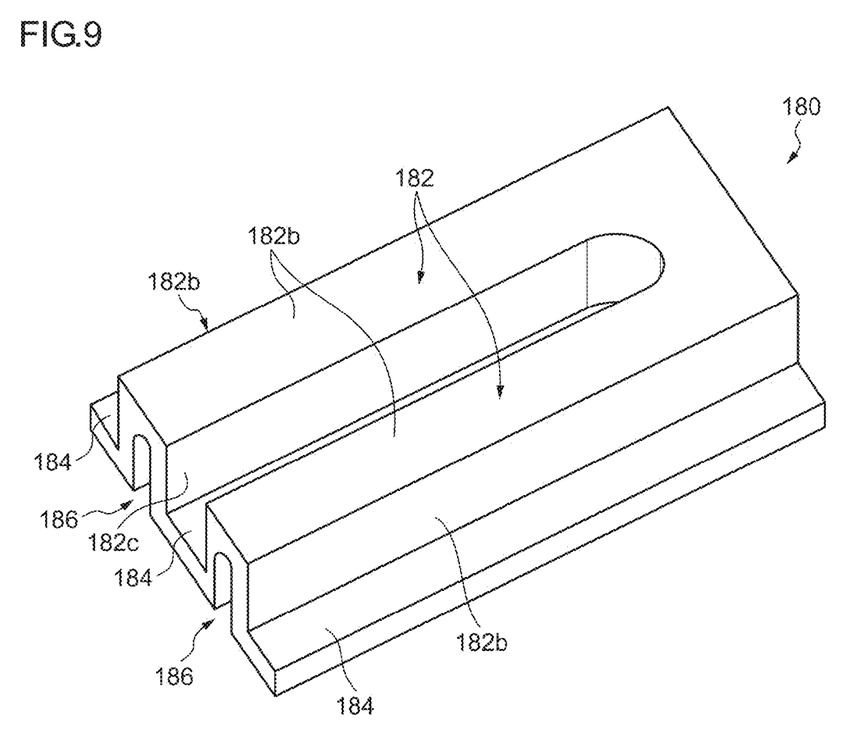
FIG. 9 is a perspective view of an external appearance illustrating an antenna cover according to another embodiment.

FIG. 8 is a schematic diagram illustrating a plasma generating device 10 according to a third embodiment and FIG. 9 is a perspective view of an external appearance illustrating an antenna cover 180 according to the third embodiment. This embodiment is different from the second embodiment in that a cross-sectional shape of a covering portion 182 to cover the upper half of an antenna 20 is a rectangular shape and an external surface of the covering portion 182 is configured by a flat top surface 182a, an outside surface 182b, and an inside surface 182c. In this embodiment, plasma P is generated mainly in a region of an inner side of the antenna 20 in a first section 12a. Hereinafter, a difference with the second embodiment will be mainly described.

The antenna cover 180 includes the covering portion 182 and a dividing portion 184. The dividing portion 184 has the same configuration as that of the dividing portion 134 according to the second embodiment described above. Meanwhile, a cross-section of the covering portion 182 in a plane orthogonal to the extension direction of the antenna 20 has an approximately rectangular shape and the covering portion 182 has a shape in which a groove 186 to accommodate the antenna 20 is formed on one surface of a prism member long in the extension direction of the antenna 20.

The covering portion 182 has a top surface 182a, an outside surface 182b, and an inside surface 182c as surfaces contacting the first section 12a. The top surface 182a is a surface provided to be distant from the antenna 20 in the upward direction. Likewise, the outside surface 182b is a surface provided to be distant from the antenna 20 in the outward direction and the inside surface 182c is a surface provided to be distant from the antenna 20 in the inward direction.

The thickness of the radial direction of the covering portion 182 is different according to a direction thereof. The thickness from the antenna 20 to the top surface 182a becomes a constant value $W_{up}$ without being changed along the extension direction of the antenna 20. Likewise, the thickness from the antenna 20 to the outside surface 182b becomes a constant value $W_{out}$ without being changed along the extension direction of the antenna 20. Because the top surface 182a and the outside surface 182b exist at positions that are hard to be exposed to the plasma P, the change in the thickness thereof rarely contributes to decreasing the local abrasion of the antenna cover 180.

Meanwhile, the thickness from the antenna 20 to the inside surface 182c is different according to the position of the extension direction of the antenna 20, differently from the top surface 182a or the outside surface 182b. For example, at the A spot close to the connection position of the first capacitor 42 having the small capacitance, the thickness of the radial direction is set to relatively large $W_{Ain}$ and at the E spot close to the connection position of the second capacitor 44 having the large capacitance, the thickness of the radial direction is set to relatively small $W_{Ein}$. Because the inside surface 182c exists at the position exposed to the plasma P generated in the inside region of the antenna 20, the change in the thickness thereof contributes to decreasing the local abrasion of the antenna cover 180.

Figure 10:
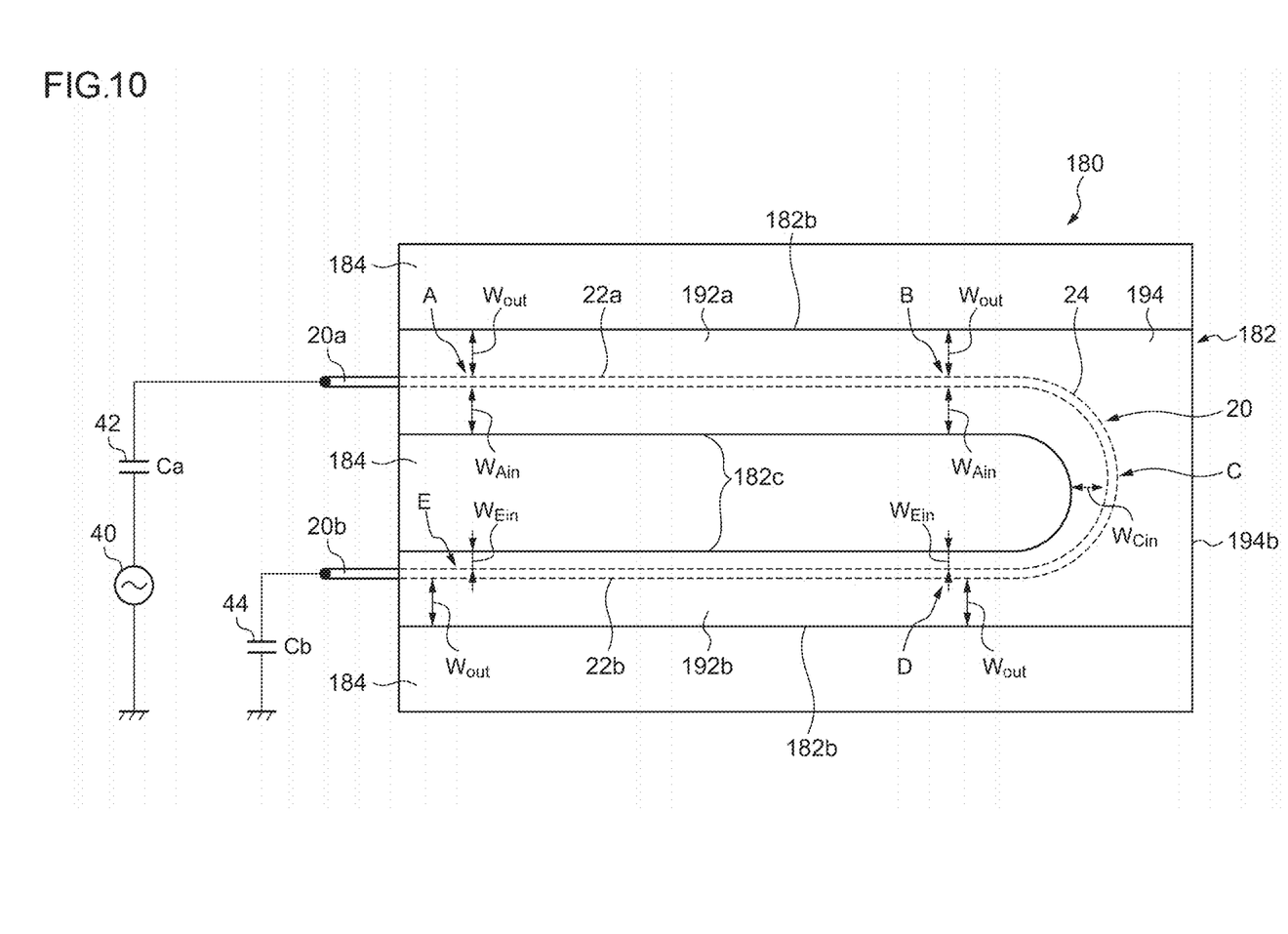
FIG. 10 is a schematic diagram illustrating a plasma generating device according to another embodiment.

FIG. 10 is a schematic diagram illustrating the plasma generating device 10 and illustrates a cross-section taken along the line X-X of FIG. 8. The covering portion 182 has a first straight line protecting portion 192a to protect a first straight line portion 22a, a second straight line protecting portion 192b to protect a second straight line portion 22b, and a curved line protecting portion 194 to protect a curved line portion 24.

As illustrated in FIG. 10, the thickness of the outward direction among the thickness of the radial directions of the covering portion 182 becomes the constant value $W_{out}$ in the first straight line protecting portion 192a and the second straight line protecting portion 192b. In other words, the thickness of the outward direction at the A spot, the B spot, the D spot, and the E spot is set to the constant value $W_{out}$. Meanwhile, in the curved line protecting portion 194, the thickness of the outward direction is arbitrarily set without depending on the shape of the curved line portion 24, so that the outside surface 194b in the curved line protecting portion 194 becomes a flat surface. The thickness of the outward direction is set as described above, so that forming of the antenna cover 180 becomes easy as compared with the case in which the thickness is changed along the extension direction of the antenna 20.

In addition, the thickness of the inward direction among the thickness of the radial directions of the covering portion 182 is set to the constant value $W_{Ain}$ in the first straight line protecting portion 192a and is set to the constant value $W_{Ein}$ in the second straight line protecting portion 192b. In other words, at the A spot and the B spot, the thickness of the inward direction is set to the common value $W_{Ain}$ and at the D spot and the E spot, the thickness of the inward direction is set to the common value $W_{Ein}$. Meanwhile, the thickness of the inward direction in the curved line protecting portion 194 is set to gradually decrease from the B spot to the D spot and the thickness of the inward direction at the C spot is set to $W_{Cin}$. Therefore, the thickness of the inward direction at the B spot, the C spot, and the D spot is in a relation of $W_{Ain} > W_{Cin} > W_{Ein}$.

In the third embodiment, with respect to the thickness of the radial direction of the covering portion 182, any value is set without depending on the position of the antenna 20 for the outward direction and the upward direction, so that manufacturing easiness of the antenna cover 180 is increased. Meanwhile, for the thickness of the inside surface 182c exposed to the plasma mainly, that is, the thickness of the inward direction toward the plasma, the thickness is changed according to the position of the antenna 20. Thereby, the ion energy in the inside surface 182c that is easy to be abraded by the plasma is equalized, so that the local abrasion of the antenna cover 180 can be decreased.

In addition, in the third embodiment, the thickness of the inward direction is set to the constant value in the first straight line protecting portion 192a and the second straight line protecting portion 192b respectively, so that the manufacturing easiness of the inside surface 182c is increased. In this case, an effect of decreasing the space dependency of the ion energy in the inside surface 182c declines. However, because the thickness is different in the first straight line protecting portion 192a and the second straight line protecting portion 192b, a difference between an abrasion degree in the first straight line protecting portion 192a and an abrasion degree in the second straight line protecting portion 192b can be decreased. Thereby, the antenna cover 180 in which the local abrasion can be decreased while the manufacturing easiness is maintained can be formed.

(Fourth Embodiment)

Figure 11:
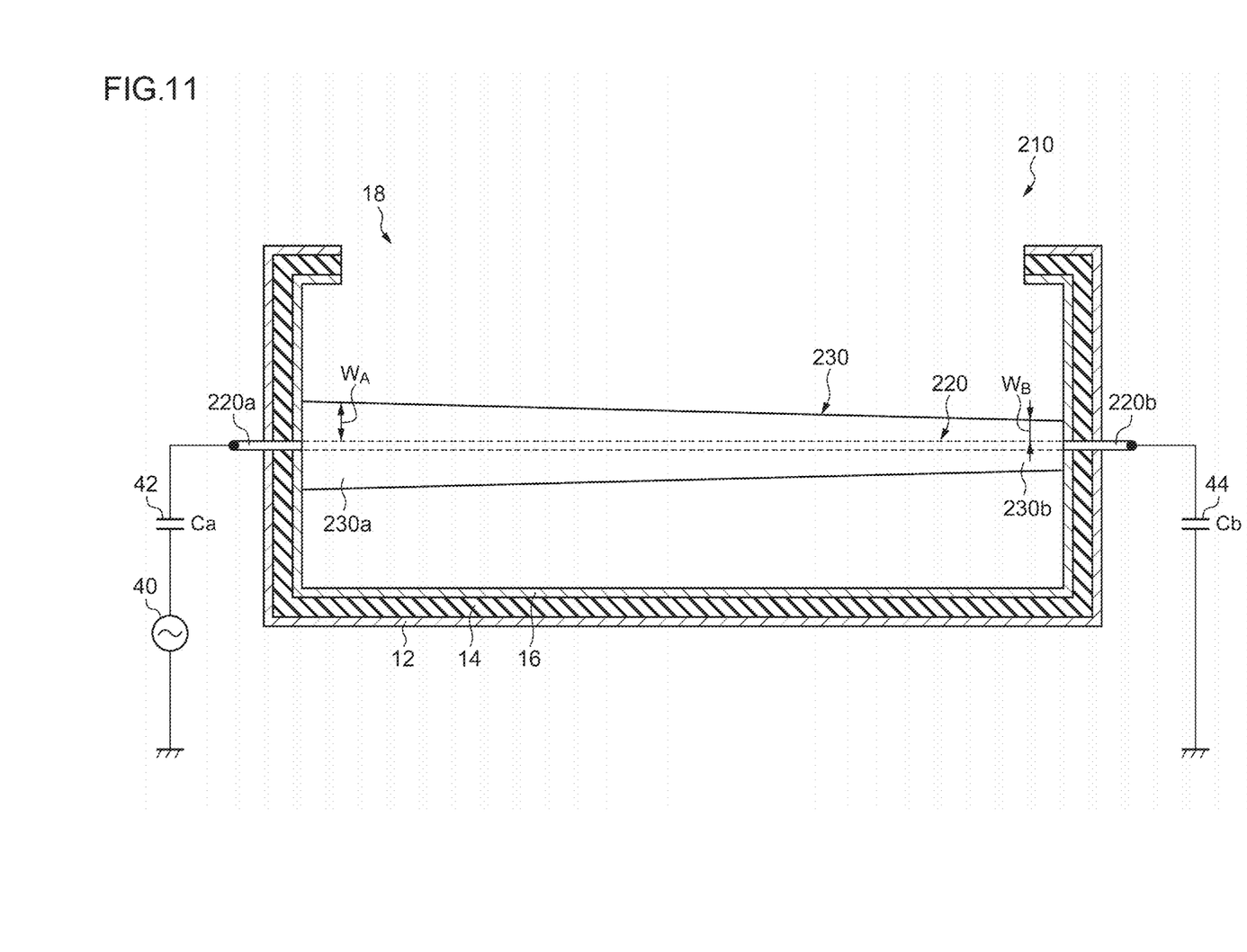
FIG. 11 is a schematic diagram illustrating a plasma generating device according to another embodiment.

FIG. 11 is a schematic diagram illustrating a plasma generating device 210 according to a fourth embodiment. This embodiment is different from the embodiments described above in that an antenna 220 has a straight line shape, not the U shape. In addition, an antenna cover 230 has a straight line shape to correspond to the antenna 220. Hereinafter, a difference from the embodiments described above will be mainly described.

The plasma generating device 210 includes a plasma chamber 12, a magnet device 14, an insulating member 16, an extraction opening 18, the antenna 220, and the antenna cover 230. The antenna 220 having the straight line shape and the antenna cover 230 to protect a surface of the antenna 220 are provided in the plasma chamber 12.

The antenna 220 has a first terminal 220a and a second terminal 220b provided at both ends, respectively. The first terminal 220a is connected to a high frequency power supply 40 through a first capacitor 42 having a first capacitance Ca and the second terminal 220b is connected to a ground through a second capacitor 44 having a second capacitance Cb. As for the capacities of the capacitors 42 and 44, the second capacitance Cb is larger than the first capacitance Ca (Ca<Cb).

The antenna cover 230 is a hollow member to cover the antenna 220 having the straight line shape. The antenna cover 230 has a shape of a circular truncated cone and the thickness $W_A$ of a radial direction in a first end 230a covering a vicinity of the first terminal 220a is larger than the thickness $W_B$ of the radial direction in a second end 230b covering a vicinity of the second terminal 220b. Therefore, the antenna cover 230 has a shape in which the thickness of the radial direction gradually decreases from the first end 230a to the second end 230b.

Even in the fourth embodiment, the thickness of the antenna cover 230 is relatively increased in the vicinity of the first terminal 220a having the small antenna capacitance and the thickness of the antenna cover 230 is decreased toward the vicinity of the second terminal 220b having the large antenna capacitance. Thereby, energies of positive ions colliding against the antenna cover 230 can be equalized and local abrasion of the antenna cover 230 can be suppressed. By suppressing the local abrasion, the life of the antenna cover 230 can be increased.

Described above is an explanation based on the exemplary embodiments of the present invention. The invention is not limited to the above-mentioned embodiments, and various design modifications may be added. It will be obvious to those skilled in the art that such modifications are also within the scope of the present invention.

In the embodiments described above, the case in which high frequency power supply is connected to the first terminal side to which the first capacitor having the relatively small capacitance Ca is provided and the second terminal side to which the second capacitor having the relatively large capacitance Cb is provided is connected to a ground, in both ends of the antenna, has been described. In a modification, the first terminal side at which the capacitance Ca is small may be connected to a ground and the high frequency power supply may be connected to the second terminal side at which the capacitance Cb is large. In this case, the thickness of the antenna cover of the first terminal side at which the antenna capacitance is small may be increased and the thickness of the antenna cover of the second terminal side at which the antenna capacitance is large may be decreased.

In the embodiments described above, the antenna cover that covers the entire surface of the antenna having the U shape or the upper half of the surface of the antenna has been described. In a modification, the antenna cover that covers only the surface corresponding to a part of the antenna path may be configured. For example, the antenna cover may not be provided in the curved line portion having the U shape and the antenna cover may be provided in only the straight line portion. In addition, the antenna cover may be provided in only the vicinity of the position where the plasma is generated.

In the embodiments described above, the antenna cover having the shape in which the thickness of the radial direction gradually decreases along the extension path of the antenna having the U shape has been described. In a modification, the thickness of the antenna cover in the radial direction may be constantly set in the certain section of the antenna path. For example, the thickness of the first straight line portion and the curved line portion may be constantly set and the thickness of the second straight line portion may be set to a constant value smaller than the thickness of the first straight line portion and the curved line portion. The thickness of the first straight line portion may be constantly set and the thickness of the curved line portion and the second straight line portion may be set to a constant value smaller than the thickness of the first straight line portion. At this time, the thickness is set differently in the first straight line portion and the second straight line portion, so that a relative difference of the ion energies on the external surface of the antenna cover can be decreased.

In the embodiments described above, the antenna cover in which the thickness of the inward direction among the thickness of the radial direction is changed along the antenna path and any thickness is set for the other thickness has been described. In a modification, the thickness for at least one direction among the thickness of the antenna cover in the radial direction may be changed along the antenna path and the thickness for different directions may be set to a constant value or any value without depending on the antenna path. In this case, the thickness of the antenna cover in the direction toward the plasma is changed along the antenna path, so that a relative difference of the ion energies in the places that are easy to be affected by the plasma can be decreased. For example, when the plasma is generated mainly in the region of the outside of the antenna, the thickness of the inward direction may be set to any value and the thickness of the antenna cover in the vertical direction or the outward direction can be changed along the antenna path.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2013-256014, filed on Dec. 11, 2013, the entire content of which is incorporated herein by reference.

What is claimed is:

1. An antenna cover for covering a surface of an antenna provided in a plasma chamber and exciting an electric field with a high frequency to an inner portion of the plasma chamber,
wherein the thickness of the antenna cover in at least one direction orthogonal to the surface of the antenna is dependent on a position on the surface, such that space dependency of an electric potential on an external surface of the antenna cover decreases, the thickness of the antenna cover being a dimension between an internal surface of the antenna cover facing to the surface of the antenna and the external surface of the antenna cover.

2. The antenna cover according to claim 1,
wherein the thickness in the at least one direction is changed along an extension direction of the antenna.

3. The antenna cover according to claim 1,
wherein the antenna includes a first terminal and a second terminal provided in both ends of the antenna and connected to a high frequency power supply through a matcher; and
the thickness in the at least one direction at the first terminal side is larger than the thickness in the at least one direction at the second terminal side.

4. The antenna cover according to claim 3,
wherein the matcher includes a first capacitor connected to the first terminal and a second capacitor connected to the second terminal; and
the first capacitor has a first capacitance smaller than a second capacitance of the second capacitor.

5. The antenna cover according to claim 3,
wherein the antenna has a U shape that is configured by a first straight line portion having the first terminal, a second straight line portion having the second terminal, and a curved line portion connecting the first straight line portion and the second straight line portion;
the antenna cover includes a first straight line protecting portion configured to protect a surface of the first straight line portion, a second straight line protecting portion configured to protect a surface of the second straight line portion, and a curved line protecting portion configured to protect a surface of the curved line portion; and
the thickness in the at least one direction in the first straight line protecting portion is larger than the thickness in the at least one direction in the second straight line protecting portion.

6. The antenna cover according to claim 5,
wherein the thickness in the at least one direction in the curved line protecting portion is smaller than the thickness in the at least one direction in the first straight line protecting portion.

7. The antenna cover according to claim 5,
wherein the thickness in the at least one direction in the curved line protecting portion is larger than the thickness in the at least one direction in the second straight line protecting portion.

8. The antenna cover according to claim 5,
wherein at least an upper half or a lower half of the surface of the antenna is covered when a direction crossing a plane formed by the U shape of the antenna is set to a vertical direction.

9. The antenna cover according to claim 8, further comprising:
a dividing portion that partitions the inner portion of the plasma chamber into two parts in the vertical direction.

10. The antenna cover according to claim 1,
wherein the antenna cover is made of quartz ($SiO_2$).

11. A plasma generating device comprising:
a plasma chamber;
a magnet that applies a magnetic field to an inner portion of the plasma chamber;
an antenna that is provided in the plasma chamber and excites an electric field with a high frequency to the inner portion of the plasma chamber; and
an antenna cover that covers a surface of the antenna,
wherein the thickness of the antenna cover in at least one direction orthogonal to the surface of the antenna is dependent on a position on the surface, such that space dependency of an electric potential on an external surface of the antenna cover decreases, the thickness of the antenna cover being a dimension between an internal surface of the antenna cover facing to the surface of the antenna and the external surface of the antenna cover.

12. The antenna cover according to claim 1,
wherein an end of the antenna is connected to a high frequency power supply.

* * * * *